(12) United States Patent
Cardona

(10) Patent No.: US 7,495,886 B2
(45) Date of Patent: Feb. 24, 2009

(54) DAMPENING OF ELECTRIC FIELD-INDUCED RESONANCE IN PARALLEL PLATE CAPACITORS

(75) Inventor: Albert Humirang Cardona, Santa Barbara, CA (US)

(73) Assignee: Agile RF, Inc., Goleta, CA (US)

( * ) Notice: Subject to any disclaimer, the term of this patent is extended or adjusted under 35 U.S.C. 154(b) by 276 days.

(21) Appl. No.: 11/492,563

(22) Filed: Jul. 24, 2006

(65) Prior Publication Data

US 2007/0025058 A1    Feb. 1, 2007

Related U.S. Application Data

(60) Provisional application No. 60/703,168, filed on Jul. 27, 2005.

(51) Int. Cl.
    *H01G 4/06*      (2006.01)
    *H01G 4/008*      (2006.01)

(52) U.S. Cl. ........................ 361/311; 361/305
(58) Field of Classification Search ............. 361/305, 361/311
See application file for complete search history.

(56) References Cited

U.S. PATENT DOCUMENTS

| | | |
|---|---|---|
| 2,802,171 A | 8/1957 | Minder |
| 3,562,637 A | 2/1971 | Gikow |
| 5,273,609 A | 12/1993 | Moslehi |
| 5,489,548 A | 2/1996 | Nishioka et al. |
| 5,593,914 A | 1/1997 | Evans, Jr. et al. |
| 5,721,700 A | 2/1998 | Katoh |
| 5,790,367 A | 8/1998 | Mateika et al. |
| 6,077,737 A | 6/2000 | Yang et al. |
| 6,222,245 B1 | 4/2001 | Bez et al. |
| 6,300,654 B1 | 10/2001 | Corvasce et al. |
| 6,377,440 B1 | 4/2002 | Zhu et al. |
| 6,383,858 B1 | 5/2002 | Gupta et al. |
| 6,432,794 B1 | 8/2002 | Lou |
| 6,451,665 B1 | 9/2002 | Yunogami et al. |
| 6,452,776 B1 | 9/2002 | Chakravorty |
| 6,503,792 B2 | 1/2003 | Hartner et al. |
| 6,646,499 B2 | 11/2003 | Tiebout |
| 6,683,341 B1 | 1/2004 | York |

(Continued)

OTHER PUBLICATIONS

Acikel, Baki et al., "A New High Performance Phase Shifter using $Ba_xSr_{1-x}TiO_3$ Thin Films," IEEE Microwave and Wireless Components Letters, vol. 12, No. 7, Jul 2002, pp. 237-239.

(Continued)

*Primary Examiner*—Eric Thomas
(74) *Attorney, Agent, or Firm*—Fenwick & West LLP

(57) ABSTRACT

A capacitor for use with RF signals of an operating frequency has a parallel plate configuration including a bottom electrode, a top electrode, and a dielectric layer disposed between the bottom and top electrodes, and an additional mass layer disposed on top of the top electrode. The parallel plate configuration is capable of receiving a DC voltage bias that affects the capacitance value of the parallel plate configuration, and exhibits a standing wave resonance frequency at the operating frequency. The mass layer has a density and a thickness selected to dampen the magnitude of the resonance of the parallel plate configuration at the standing wave resonance frequency and shift the standing wave resonance frequency away from the operating frequency.

4 Claims, 2 Drawing Sheets

U.S. PATENT DOCUMENTS

| | | | |
|---|---|---|---|
| 6,737,930 | B2 | 5/2004 | Toncich |
| 7,042,701 | B2 | 5/2006 | Diorio et al. |
| 2003/0067023 | A1 | 4/2003 | Olewine et al. |
| 2004/0087082 | A1 | 5/2004 | Nakata |
| 2004/0259316 | A1 | 12/2004 | Acikel et al. |
| 2006/0274476 | A1* | 12/2006 | Cervin-Lawry et al. .. 361/306.3 |

OTHER PUBLICATIONS

Acikel, Baki et al., "BST Varactor Design and Fabrication," project funded by DARPA FAME Program, 1 page [online], [retrieved on Jun. 28, 2004]. Retrieved from the Internet <URL: http://my.ece.ucsb.edu/yorklab/Projects/Ferroelectrics/Devices/bstdevicedesign.htm>.

Acikel, Baki et al., "Overview of Program," DARPA FAME Program, 8 pages [online], [retrieved on Jun. 23, 2004]. Retrieved from the Internet <URL: http://my.ece.ucsb.edu/yorklab/Projects/Ferroelectrics/Devices/Devicedesign.pdf>.

Acikel, Baki et al., "Technology Comparison," DARPA FAME Program, 6 pages [online], [retrieved on Jun. 23, 2004]. Retrieved from the Internet <URL: http://my.ece.ucsb.edu/yorklab/Projects/Ferroelectrics/Devices/VaractorComparison.pdf>.

Erker, Erich G. et al., "Monolithic Ka-Band Phase Shifter Using Voltage Tunable BaSrTiO3 Parallel Plate Capacitors," IEEE Microwave and Guided Wave Letters, vol. 10, No. 1, Jan. 2000, pp. 10-12.

IMS2000 Workshop "Ferroelectric Materials and Microwave Applications," 1 page [online], [retrieved on Jun. 28, 2004]. Retrieved from the Internet <URL: http://my.ece.ucsb.edu/yorklab/Projects/Ferroelectrics/IMS2000%20Workshop/ims2000_workshop.htm>.

Liu, Yu et al., "BaSrTioO$_3$ Interdigitated Capacitors for Distributed Phase Shifter Applications," IEEE Microwave and Guided Wave Letters, vol. 10, No. 11, Nov. 2000, pp. 448-450.

Liu, Yu et al., "High-performance and Low-cost Distributed Phase Shifters Using Optimized BaSrTiO$_3$ Interdigitated Capacitors," Electrical and Computer Engineering Dept., Materials Dept., University of California at Santa Barbara, Santa Barbara, CA 93106, 14 pages [online], [retrieved on Jun. 24, 2003]. Retrieved from the Internet <URL: http://my.ece.ucsb.edu/yorklab/Publications/pubs.htm>.

Nagra, Amit S. et al., "Distributed Analog Phase Shifters with Low Insertion Loss," IEEE Transactions on Microwave Theory and Techniques, vol. 47, No. 9, Sep. 1999, pp. 1705-1711.

Padmini, P. et al., "Realization of High Tunability Barium Strontium Titanate Thin Films by RF Magnetron Sputtering," Applied Physics Letters, vol. 75, Nov. 1999, pp. 3186-3188.

Serraiocco, J. et al., "Tunable Passive Integrated Circuits Using BST Thin Films," presented at IFFF 2002, International Joint Conference on the Applications of Ferroelectrics, Kyoto, Japan, May 2002, 10 pages [online], [retrieved on Jun. 24, 2003]. Retrieved from the Internet <URL: http://my.ece.ucsb.edu/yorklab/Publications/pubs.htm>.

Taylor, T. R. et al., "Impact of thermal strain on the dielectric constant of sputtered barium strontium titanate thin films," Applied Physics Letters, vol. 80, No. 11, Mar. 18, 2002, pp. 1978-1980.

Taylor, T. R. et al., "Optimization of RF Sputtered Barium Strontium Titanate (BST) Thin Films for High Tunability," presented at MRS Conference, Fall 1999, 2 pages [online], [retrieved on Jun. 24, 2003]. Retrieved from the Internet <URL: http://my.ece.ucsb.edu/yorklab/Publications/pubs.htm>.

Taylor, T. R. et al., "RF Sputtered High Tunability Barium Strontium Titanate (BST) Thin Films for High Frequency Applications," presented at ISIF 2000 Conference, Aachen, Germany, Mar. 2000, 2 pages [online], [retrieved on Jun. 24, 2003]. Retrieved from the Internet <URL: http://my.ece.ucsb.edu/yorklab/Publications/pubs.htm>.

Taylor, Troy et al., "BST Growth Optimization," project funded by DARPA FAME Program, 2 pages [online], [retrieved on Jun. 28, 2004]. Retrieved from the Internet <URL: http://my.ece.ucsb.edu/yorklab/Projects/Ferroelectrics/Materials/growthopt.htm>.

Taylor, Troy et al., "Loss Model for BST Test Capacitors," DARPA FAME Program, 6 pages [online], [retrieved on Jun. 23, 2004]. Retrieved from the Internet <URL: http://my.ece.ucsb.edu/yorklab/Projects/Ferroelectrics/Materials/LowFrequency.pdf>.

Taylor, Troy et al., "Materials Issues To Be Explored," DARPA FAME Program, 10 pages [online], [retrieved on Jun. 23, 2004]. Retrieved from the Internet <URL: http://my.ece.ucsb.edu/yorklab/Projects/Ferroelectrics/Materials/growth.pdf>.

York, Bob et al., "Thin-Film Ferroelectrics: Deposition Methods and Applications," presented at the International Microwave Symposium in Boston, MA, Jun. 2000, p. 20 [online], [retrieved on Jun. 23, 2004]. Retrieved from the Internet <URL: http://my.ece.ucsb.edu/yorklab/Projects/Ferroelectrics/IMS2000%20Workshop/Bob-oral.pdf>.

York, R. et al., "Books and Book Chapters," Microwave Electronics Lab, 4 pages [online], [retrieved on Jun. 23, 2004]. Retrieved from the Internet <URL: http://my.ece.ucsb.edu/yorklab/Publications/pubs.htm>.

York, R. et al., "Microwave Integrated Circuits using Thin-Film BST," presented at ISAF Conference, Honolulu, Hawaii, Jul. 21-Aug. 2, 2000, 6 pages [online], [retrieved on Jun. 23, 2003]. Retrieved from the Internet <URL: http://my.ece.ucsb.edu/yorklab/Publications/pubs.htm>.

York, Robert A. et al., "Synthesis and Characterization of $(Ba_xSr_{1-x})Ti_{1+y}O_{3+z}$ Thin Films and Integration into Microwave Varactors and Phase Shifters," Journal of Integrated Ferroelectrics, vol. 34, Apr. 10, 2000, pp. 177-188.

York, Robert A. et al., "Thin-Film Phase Shifters for Low-Cost Phased Arrays," presented at Workshop on Affordability and Cost Reduction for Radar Systems, Huntsville, Alabama, Apr. 2000, and at URSI Conference, Salt Lake City, Utah, Jul. 2000, 10 pages [online], [retrieved on Jun. 24, 2003]. Retrieved from the Internet <URL: http://my.ece.ucsb.edu/yorklab/Publications/pubs.htm>.

* cited by examiner

DAMPENING OF ELECTRIC FIELD-INDUCED RESONANCE IN PARALLEL PLATE CAPACITORS

CROSS-REFERENCE TO RELATED APPLICATION

This application claims priority under 35 U.S.C. §119(e) from co-pending U.S. Provisional Patent Application No. 60/703,168, entitled "Dampening of Electric Field-Induced Resonance," filed on Jul. 27, 2005, which is incorporated by reference herein in its entirety.

BACKGROUND OF THE INVENTION

1. Field of the Invention

The present invention generally relates to the field of electronics, and more specifically, to thin film capacitors.

2. Description of the Related Art

Capacitors are a basic building block for electronic circuits. One design for capacitors is the parallel-plate configuration, in which a dielectric is sandwiched between two electrodes. FIG. 1 is a block diagram illustrating a typical metal-insulator-metal (MIM) parallel plate configuration of a thin film capacitor 100. The capacitor 100 is formed as a vertical stack composed of a metal base electrode 110b, a dielectric 120, and metal top electrode 110a supported by a substrate 130. The lateral dimensions, along with the dielectric constant and thickness of the dielectric 120, determine the capacitance value.

Materials in the barium strontium titanate (BST) family have characteristics that are well suited for use in such capacitors. BST generally has a high dielectric constant so that large capacitances can be realized in a relatively small area. Furthermore, BST has a permittivity that depends on the applied electric field. As a result, voltage-variable capacitors (varactors) can be produced, with the added flexibility that their capacitance can be tuned by changing a bias voltage across the capacitor. In addition, the bias voltage typically can be applied in either direction across a BST capacitor since the film permittivity is generally symmetric about zero bias. That is, BST typically does not exhibit a preferred direction for the electric field. One further advantage is that the electrical currents that flow through BST capacitors are relatively small compared to other types of semiconductor varactors.

Some devices utilizing BST capacitors require the application of a DC bias voltage for optimal performance. Examples of such devices include transmit/receive filters, impedance matching networks, delay lines, phase shifters, and antennas.

However, the voltage applied to BST materials can also induce a piezoelectric effect which can be detrimental to the device operation. Due to the intrinsic properties of the BST material, the electric field generated within the BST thin film 120 enables the conversion of electrical energy into mechanical energy. As the RF signal passes through the biased capacitor, part of its energy is converted into mechanical energy which then oscillates back-and-forth within the MIM structure forming a standing wave resonance. This standing wave will continue to draw energy away from the RF signal as long as the DC electric field remains. Consequently, this effect increases the transmission loss of the capacitor and leads to a degradation of overall device performance.

FIG. 2 is a graph illustrating RF transmission measurements, of the typical configuration of the capacitor 100, as a function of frequency of the RF signal voltage. Two curves are shown, corresponding to different applied DC voltage. At zero applied voltage, curve 210 shows a well-behaved response. By contrast, at an applied voltage of 20V, curve 220 shows a large resonance appearing at a specific frequency of 3.7 GHz caused by the piezoelectric effect.

As a result, there is a need for a system and method to decouple a frequency associated with a standing wave resonance of a capacitor from an operating frequency associated with an RF signal transmitted through the capacitor.

SUMMARY OF THE INVENTION

The present invention overcomes the limitations of the related art by providing various systems and methods for forming capacitors such that physical resonances do not interfere with the operating frequencies of the intended RF signals. In one embodiment, an additional mass of material (e.g., gold, platinum, or tungsten) is placed on top of a capacitor. The additional mass can dampen the magnitude of resonant vibrations experienced during signal transmission. A thickness and type of the material can be varied to adjust the dampening.

In one embodiment, the capacitor includes a thin film dielectric composed of a barium strontium titanate, or BST material (e.g., $Ba_xSr_{1-x}TiO_3$). The BST material can have a dielectric constant that varies as a function of DC voltage across the capacitor. A DC voltage bias can be applied to the capacitor, and have a value depending on the application. By constructing a capacitor where the physical resonance does not couple well with the RF signal, system performance is improved by reducing the amount of energy drawn from RF signals transmitted through these capacitors. More specifically, the piezoelectric effect is mitigated from high frequency devices utilizing thin film capacitors formed from BST materials.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 3:
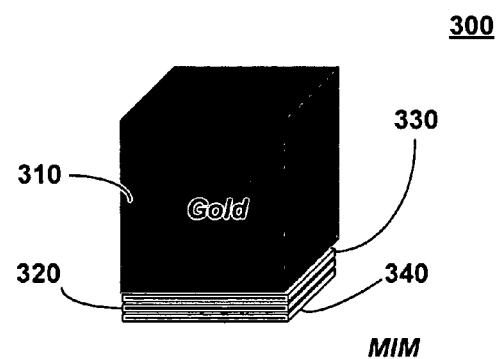
FIG. 3 is a block diagram illustrating a capacitor according to one embodiment of the present invention.

FIG. 3 is a block diagram illustrating a parallel-plate capacitor according to one embodiment of the present invention. The capacitor 300 includes an additional mass layer 310 and a parallel plate configuration including a thin film dielectric layer 320 disposed between the top electrode 330 and the bottom electrode 340.

The mass layer 310 of FIG. 3 is formed from gold in one embodiment, but in other embodiments can be formed from other materials such as platinum, tungsten, or lead. The mass layer 310 has a sufficient combination of thickness and density such that the magnitude of the standing wave resonance is dampened and the overall standing wave resonance of the capacitor 300 does not strongly couple at the operating frequency of the device. In one embodiment, factors affecting the standing wave resonance include the piezoelectric effect from the parallel plate configuration 320 induced by the DC bias voltage applied to the parallel plate configuration 320. In general, the additional mass layer dampens or reduced the magnitude of resonance to achieve decoupling.

More specifically, the layer 310 can be modeled as a large mass overlaid onto the parallel plate configuration modeled as a spring, in order to reduce the mechanical vibrations within the structure. The mass-spring model is analogous to having one end of the spring affixed to a wall (i.e., the substrate) and another end that is free to move. After an initial push or tug, a small mass attached on the free end of the spring will oscillate back-and-forth a certain displacement distance and at a certain frequency. As the size of the mass is increased, the displacement distance will decrease as well as the frequency.

In one embodiment, material for the mass layer 310 is selected to be consistent with the overall fabrication process. The fabrication of layer 310 preferably does not add any additional processing steps to the overall fabrication process and requires only a change in the mask set. For example, in one design of devices using BST capacitors, a thicker gold layer is applied to form the electrodes 330, 340. The same processing step can be used to add gold as the mass layer 310. For further details regarding the fabrication of BST capacitor, see U.S. patent application Ser. No. 10/822,563, "Fabrication of Parallel Plate Capacitors Using BST Thin Films," which is incorporated herein by reference.

The parallel plate configuration can be, for example, a metal-insulator-metal (MIM) vertical stack. The vertical stack can be formed by, for example, a metal base electrode 340, a dielectric 320, and a top electrode 330 supported by a substrate (not shown in FIG. 3). In one embodiment, the parallel plate configuration includes a thin film dielectric 320 composed of material from the barium strontium titanate (BST) family (e.g., $Ba_xSr_{1-x}TiO_3$). BST materials have desirable dielectric properties for various RF and microwave devices. BST materials can have dielectric constants that are independent of frequency up to 100 GHz and loss tangents of 0.004 to 0.01. In addition, the dielectric constant can be tunable upon application of a DC voltage. For example, in a MIM parallel plate capacitor structure, a DC voltage generating an electric field of 1 MV/cm can change the dielectric constant by factors of 2 to 3. These properties are attractive for electrically tunable devices such as tunable RF and microwave filters, impedance matching networks, and phase shifters. Note that in some applications, however, the capacitor 300 can have a fixed capacitance.

Figure 1:
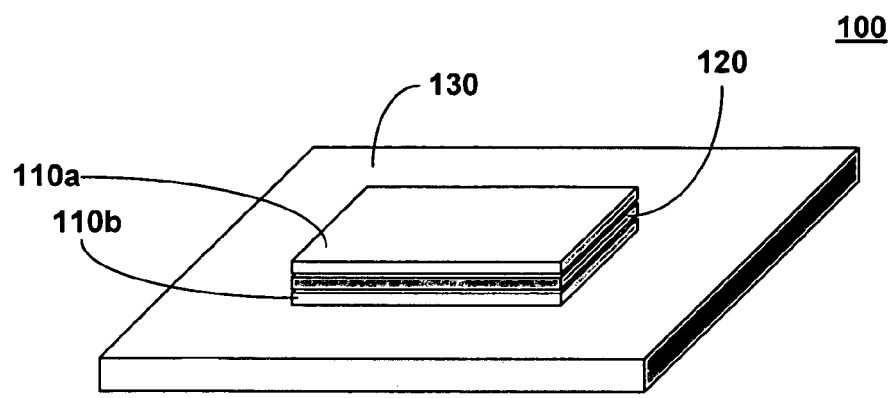
FIG. 1 is a block diagram illustrating a typical configuration of a thin film, parallel plate capacitor.
Figure 2:
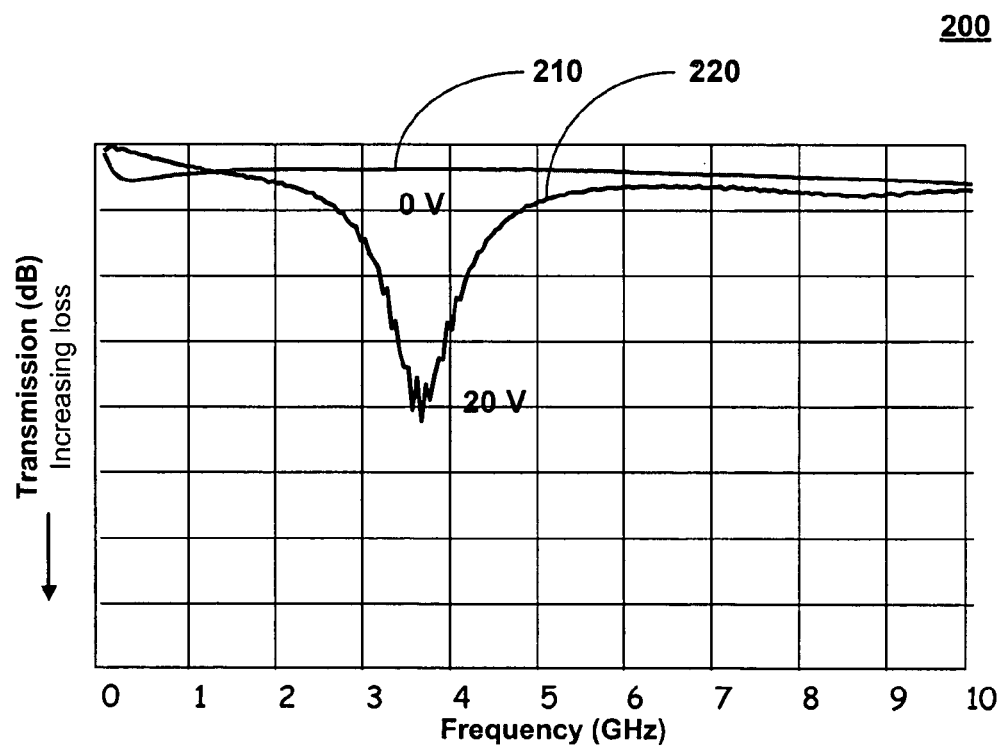
FIG. 2 is a graph illustrating RF transmission measurements of a typical parallel plate capacitor, as a function of RF signal frequency and applied DC voltage.
Figure 4:
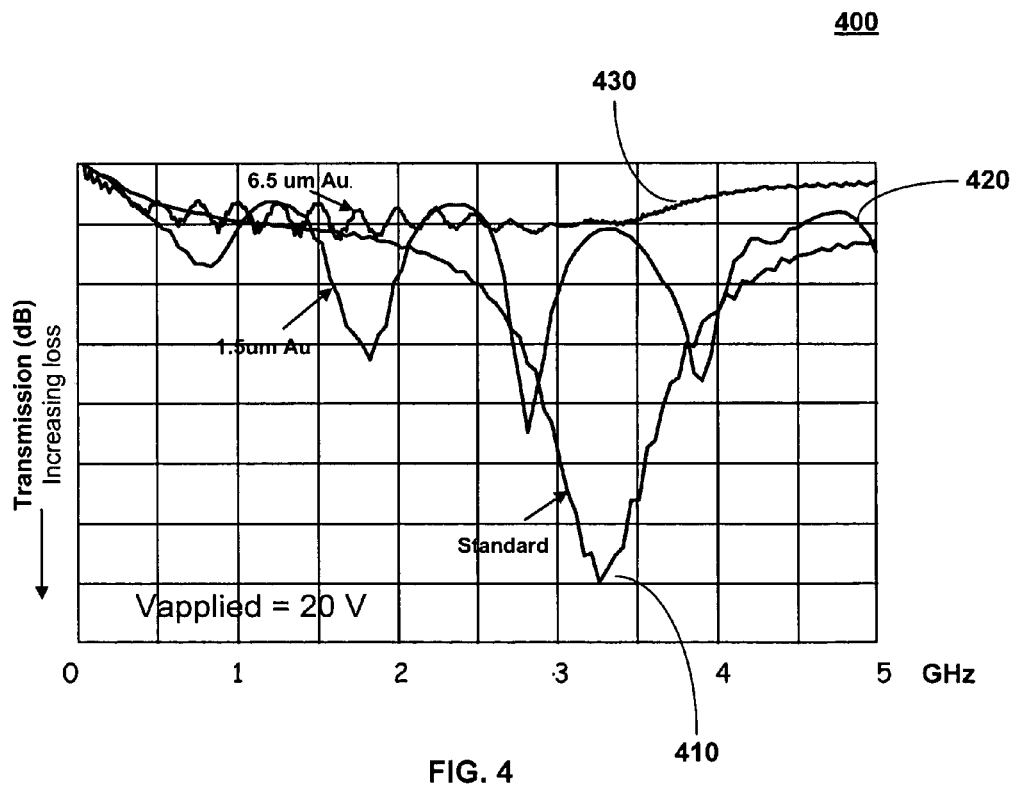
FIG. 4 is a graph illustrating RF transmission measurements of a parallel plate capacitor of FIG. 3, as a function of RF signal frequency and applied DC voltage

FIG. 4 is a graph illustrating RF transmission measurements, of the capacitor 300 of FIG. 3, as a function of frequency of the RF signal and applied DC voltage. The graph shows two curves 420,430 which are representative the capacitor 300 having gold metal layers 310 of different thicknesses. The two curves 420,430 can be compared to curve 410 which is representative of the typical capacitor 100 from FIG. 1. For the 1.5 µm thick gold layer (curve 420), the fundamental resonant frequency appears to shift from 3.3 GHz down to 0.8 GHz. Curve 420 also shows additional resonances, which appear to be harmonics of the fundamental resonance. However, the magnitude of the largest resonance is now a factor of two smaller than for curve 410. For the 6.5 µm thick gold layer (curve 430), the fundamental resonant frequency shifted down to 0.4 GHz and the largest resonance has been reduced by a factor of 12 (as well as possibly shifted outside the operating frequency band for the device). These measurements show clearly the reduction of the piezoelectric resonance and improvement in the RF transmission characteristics.

Upon reading this disclosure, those of skill in the art will appreciate still additional alternative structural and functional designs for a system and a process for forming capacitors through the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A capacitor for use with RF signals at an operating frequency of a device in which the capacitor is used, the capacitor comprising:
    a parallel plate configuration including a bottom electrode, a top electrode, and dielectric disposed between the bottom electrode and the top electrode and exhibiting a standing wave resonance frequency at the operating frequency, the parallel plate configuration capable of receiving a DC voltage bias that affects a capacitance value of the parallel plate configuration; and
    at least an additional mass layer physically connected to the parallel plate configuration, a density and a thickness of said additional mass layer being selected to dampen a magnitude of a resonance of the parallel plate configuration at the standing wave resonance frequency and shift the standing wave resonance frequency away from the operating frequency of the device in which the capacitor is used.

2. The capacitor of claim 1 wherein the dielectric comprises barium strontium titanate.

3. The capacitor of claim 2 wherein the standing wave resonance is caused by a piezoelectric effect in the barium strontium titanate induced by the DC voltage bias applied to the parallel plate configuration.

4. The capacitor of claim 1 wherein the additional mass layer comprises one of gold, platinum, tungsten, and lead.

* * * * *